United States Patent [19]

Yanagigawa

[11] Patent Number: 5,596,216

[45] Date of Patent: Jan. 21, 1997

[54] SEMICONDUCTOR DEVICE WITH DIODE AND CAPABLE OF DEVICE PROTECTION

[75] Inventor: Hiroshi Yanagigawa, Shiga, Japan

[73] Assignee: NEC Corporation, Tokyo, Japan

[21] Appl. No.: 550,810

[22] Filed: Oct. 31, 1995

[30]     Foreign Application Priority Data

Oct. 31, 1994  [JP]  Japan ................................. 6-266481

[51] Int. Cl.$^6$ ................................................. H01L 23/62
[52] U.S. Cl. .......................... 257/355; 257/356; 257/360; 257/494
[58] Field of Search .................................. 257/355, 356, 257/360, 491–496, 357

[56]              References Cited

FOREIGN PATENT DOCUMENTS 55-103769  8/1980  Japan ..................................... 257/355

OTHER PUBLICATIONS

Japanese Non–Examined Patent Publication No. 64–80073 (with English statement of relevance), Mar. 1989.

*Primary Examiner*—Minh Loan Tran
*Attorney, Agent, or Firm*—Sughrue, Mion, Zinn, Macpeak & Seas

[57]              ABSTRACT

A semiconductor device with a diode is provided, which enables a low operating resistance after breakdown and a small chip area. A first impurity doped region of a first conductivity type acting one part of the diode is formed in a semiconductor substrate. A second impurity doped region of a second conductivity type acting the other part of the diode is formed in the substrate. The first and second impurity doped regions produce a first p-n junction at their interface. A third impurity doped region of the first conductivity type is formed in the second impurity doped region to be electrically connected to the first impurity doped region. The third and second impurity doped region produce a second p-n Junction at their interface. When a reverse voltage is applied across the first and second impurity doped regions, a first depletion region is created near the first p-n junction and a second depletion region is created near the second p-n junction. When an excessive, reverse voltage is applied across the first and second impurity doped regions, the first and second depletion regions merge together. The substrate may act as the first impurity doped region.

11 Claims, 6 Drawing Sheets 5,596,216

SEMICONDUCTOR DEVICE WITH DIODE AND CAPABLE OF DEVICE PROTECTION

FIELD OF THE INVENTION

The present invention relates to a semiconductor device and more particularly, to a semiconductor device having a diode capable of device protection and a fabrication method thereof.

DESCRIPTION OF THE PRIOR ART

A conventional semiconductor device of this sort is shown in FIG. 1, in which field insulator films 5a and 5b are formed on a chief surface of a P-type semiconductor substrate 1. The outer field insulator film 5b surrounds the inner field insulator film 5a. The outer film 5b defines an active region in which a diode with a high reverse breakdown voltage is provided. A window W1 is formed by the inner film 5a. A window W2 is formed by the inner and outer films 5a and 5b.

An N-type cathode region 2 is formed in the active region by selectively doping an N-type impurity. The interface of the substrate 1 and the cathode region 2 has an upper end exposed through the window W2 from the field insulator films 5a and 5b. The upper end of this interface laterally extends along the window W2. This interface produces a p-n junction of the diode.

An N$^+$-type cathode contact region 3 is formed in the active region by selectively, heavily doping an N-type impurity. The cathode contact region 3 is positioned on the cathode region 2 and is exposed through the window W1 from the field oxide films 5a and 5b. The region 3 is contacted with the cathode region 2.

A P$^+$-type anode contact region 4 is formed in the active region by selectively, heavily doping of a P-type impurity. The anode contact region 4 is exposed through the window W2 from the field oxide films 5a and 5b, and is positioned on the interface of the cathode region 2 and the substrate 1. The region 4 bridges the region 2 and the substrate 1, in other words, the region 4 is contacted with both of the region 2 and the substrate 1.

A cathode electrode 8 is formed on the cathode contact region 3. An anode electrode 7 is formed on the anode contact region 4.

When a reverse voltage is applied across the anode electrode 7 and the cathode electrode 8, a depletion region is created near the P-N junction between the N-type cathode region 2 and the P-type substrate 1. Almost all the depletion region is on the side of the cathode region 2 and grows with the increasing reverse voltage. Finally, the depletion region becomes contacted with the bottom of the field insulator film 5a, i.e., becomes pinched off. The applied voltage at this time is the reverse breakdown voltage of the diode.

Therefore, the reverse breakdown voltage of the diode is defined by the lateral distance between the anode and cathode contact regions 4 and 3, or between the anode and cathode electrodes 7 and 8. The reverse breakdown voltage increases with the increasing lateral distance If no pinch off effect takes place during this process, the field insulator films 5a and 8b are finally destroyed. In consideration with this phenomenon, the doping concentration and depth of the cathode region 2 are designed so that the depletion region is ensured to reach the films 5a and 5b prior to the electronic destruction or breakdown of the films 5a and 5b. Consequently, a high reverse breakdown voltage can be stably obtained.

With the conventional semiconductor device shown in FIG. 1, because the depletion region is ensured to reach the films 5a and 5b (i.e., pinch off) prior to the electronic destruction or breakdown of the films 5a and 5b, the doping concentration of the cathode region 2 needs to be light and the depth of the region 2 needs to be shallow. This results in a high operation resistance per unit area of the diode after breakdown.

Such the high operation resistance causes a problem of a large chip area of the diode.

Also, the inventor, Yanagigawa, invented a lateral metal-oxide-semiconductor field-effect transistor (MOSFET) having an extension drain region, which was filed as the Japanese Patent Application No. 6-154025 on Jul. 6, 1994. When the diode of the conventional semiconductor device of FIG. 1 is employed as a protection diode for the MOSFET, the following problem occurs:

The N-type cathode region 2 is different in doping concentration from the extension drain region, and therefore, the cathode region 2 has to be formed through a separate process step from the step of forming the extension drain region. This means that an additional process step is required due to addition of the diode.

Further, since the breakdown voltage is defined by the lateral distance between the anode and cathode electrodes 7 and 8, the diode is difficult to be designed to be higher in breakdown voltage than the MOSFET with high accuracy.

SUMMARY OF THE INVENTION

Accordingly, an object of the present invention is to provide a semiconductor device with a diode that enables to reduce the operation resistance per unit area of the diode after its breakdown.

Another object of the present invention is to provide a semiconductor device with a diode that enables to reduce the necessary chip size.

Still another object of the present invention is to provide a semiconductor device with a diode and a fabrication method thereof that enables to facilitate the breakdown voltage design of the diode.

Further object of the present invention is to provide a fabrication method of a semiconductor device with an FET and a diode that requires no additional step for forming the diode.

A semiconductor device according to a first aspect of the present invention contains a first impurity doped region of a first conductivity type and a second impurity doped region of a second conductivity type formed in a semiconductor substrate. The first impurity doped region forms one part of a diode and the second impurity doped region forms the other part thereof. The first and second impurity doped regions produce a first p-n junction at their interface.

The device further contains a third impurity doped region of the first conductivity type formed in the second impurity doped region. The third impurity doped region is electrically connected to the first impurity doped region. The third and second impurity doped regions produce a second p-n junction at their interface.

When a reverse voltage is applied across the first and second impurity doped regions, a first depletion region is created near the first p-n junction and a second depletion region is created near the second p-n junction. When the reverse voltage is over a breakdown voltage of the diode, the first and second depletion regions merge together.

With the semiconductor device according to the first aspect of the invention, a reverse voltage applied across the first and second impurity doped regions creates a first depletion region near the first p-n junction and a second depletion region near the second p-n junction. The first and second depletion regions merge together due to the reverse voltage over a breakdown voltage of the diode.

Therefore, the breakdown voltage is defined by the third impurity doped region, in other words, the doping concentration and the depth of the second impurity doped region can be set independent of the breakdown voltage. This means that the doping concentration of the second impurity doped region can be high and the depth thereof can be large.

As a result, the operation resistance per unit area of the diode after its breakdown can be reduced. This leads to reduction of the necessary chip area of the semiconductor device.

Also, since the breakdown voltage of the diode is defined by the third impurity doped region, the breakdown voltage of the diode can be readily designed.

In a preferred embodiment, the semiconductor substrate is of the first conductivity type and acts as the first impurity doped region. An advantage that the impurity doped region can be omitted is obtained.

In another preferred embodiment, the device further comprises an FET formed on the substrate. The FET has an extension drain region and an electric-field relaxation region in the substrate. The diode serves as a protection diode of the FET against electrostatic charges. An advantage that the extension drain region and the electric-field relaxation region can be formed during the same steps of forming the second impurity doped region and forming said third impurity doped region, respectively is obtained.

A fabrication method of a semiconductor device with an FET and a diode according to a second aspect of the present invention includes the following two steps.

One of the steps is to dope an impurity of the second conductivity type into the substrate to simultaneously form the second impurity doped region of the diode and the extension drain region of the FET.

The other of the steps is to dope an impurity of the first conductivity type into the second impurity doped region and the extension drain region to simultaneously form the third impurity doped region of the diode and the electric-field relaxation region of the FET.

With the fabrication method of the second aspect of the invention, an impurity of the second conductivity type is doped into the substrate to simultaneously form the second impurity doped region of the diode and the extension drain region of the FET, and an impurity of the first conductivity type is doped into the second impurity doped region and the extension drain region to simultaneously form the third impurity doped region of the diode and the electric-field relaxation region of the FET.

Accordingly, no additional step is required for forming the diode.

Also, since the breakdown voltage of the diode is defined by the third impurity doped region, the breakdown voltage of the diode can be readily designed.

DETAILED DESCRIPTION OF THE PREFERRED EMBODIMENTS

Figure 1:
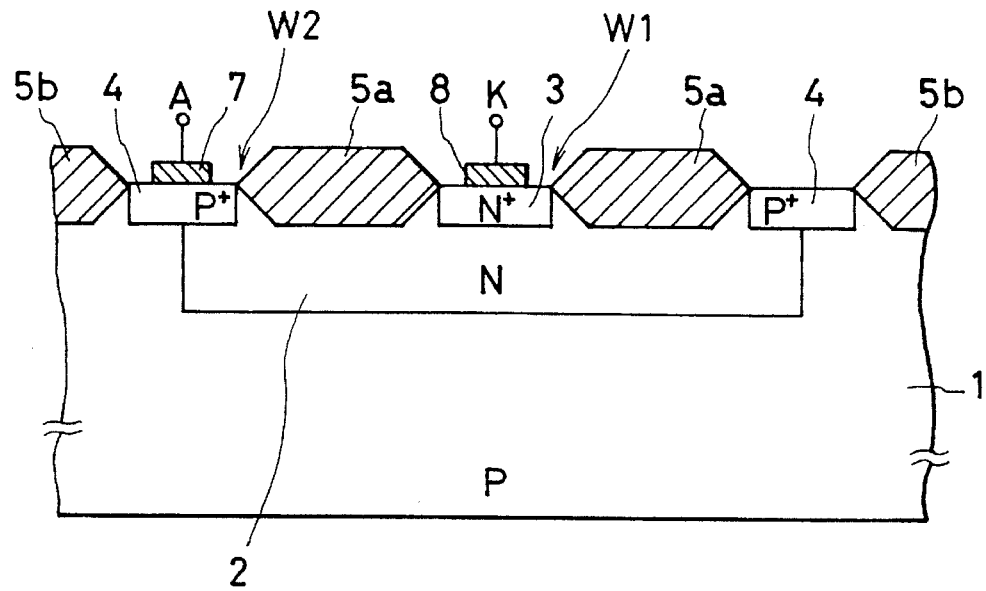
FIG. 1 is a partial cross-sectional view of a conventional semiconductor device with a diode.

Preferred embodiments of the present invention will be described below while referring to the drawings attached.

FIRST EMBODIMENT

Figure 2:
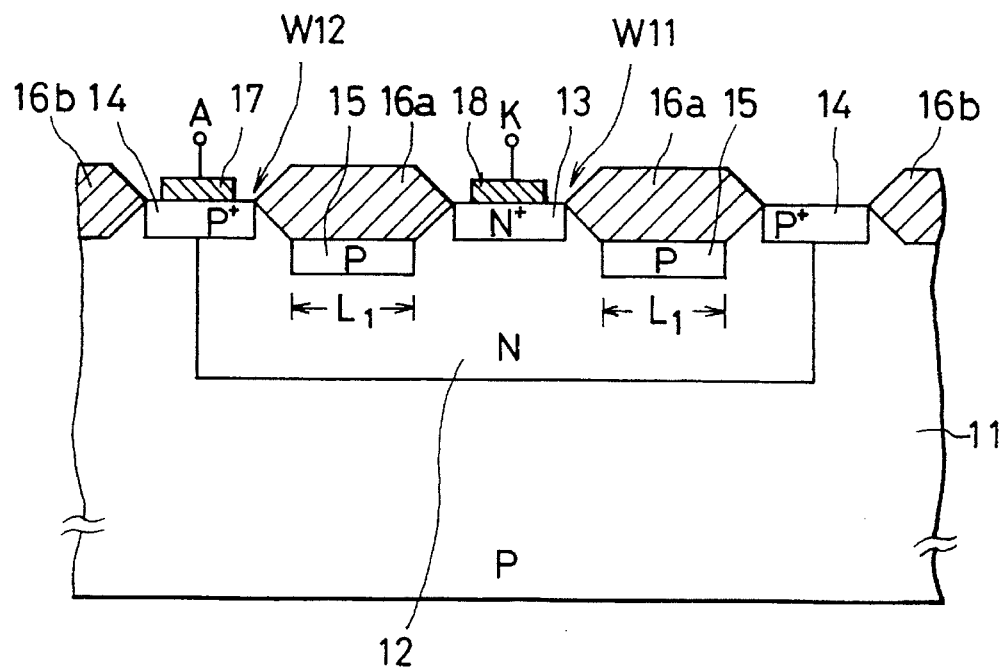
FIG. 2 is a partial cross-sectional view of a semiconductor device with a diode according to a first embodiment of the invention.

A semiconductor device with a diode according to a first embodiment has a configuration as shown in FIG. 2.

In FIG. 2, field insulator films 16a and 16b are formed on a chief surface of a P-type semiconductor substrate 11. The outer field insulator film 16b surrounds the inner field insulator film 16a. The outer film 16b defines an active region in which a diode with a high reverse breakdown voltage is provided. A window W11 is formed by the inner film 16a. A window W12 is formed by the inner and outer films 16a and 16b.

An N-type cathode region 12 is formed in the active region by selectively doping an N-type impurity. The interface of the substrate 11 and the cathode region 12 has an upper end exposed through the window W12 from the field insulator films 16a and 16b. The upper end of this interface laterally extends along the window W12. This interface produces a p-n junction of the diode.

An N$^+$-type cathode contact region 13 is formed in the active region by selectively, heavily doping an N-type impurity. The cathode contact region 13 is positioned on the cathode region 12 and is exposed through the window W11 from the field oxide films 16a and 16b. The region 13 is contacted with the cathode region 12.

A P$^+$-type anode contact region 14 is formed in the active region by selectively, heavily doping a P-type impurity. The anode contact region 14 is exposed through the window W12 from the field oxide films 16a and 16b, and is positioned on the interface of the cathode region 12 and the substrate 11. The region 14 bridges the region 12 and the substrate 11, in other words, the region 14 is contacted with both of the region 12 and the substrate 11.

A cathode electrode 18 is formed on the cathode contact region 13. An anode electrode 17 is formed on the anode contact region 14.

A P-type breakdown-voltage definition region 15 is formed in the N-type cathode region 12 to extend along the inner field insulator film 16a by selectively doping a P-type impurity. The region 15 is contacted with the bottom of the film 16a. The region 15 is electrically connected to the substrate 11 through a conductive path (not shown), in other words, the region 15 and the substrate 11 are controlled to be in the same electric potential. Here, the region 15 and the substrate 11 are grounded. The region 15 has a lateral distance $L_1$ along the line connecting the cathode and anode contact regions 13 and 14. The P-type region 15 and the N-type cathode region 12 produce another p-n junction at their interface.

Figure 3:
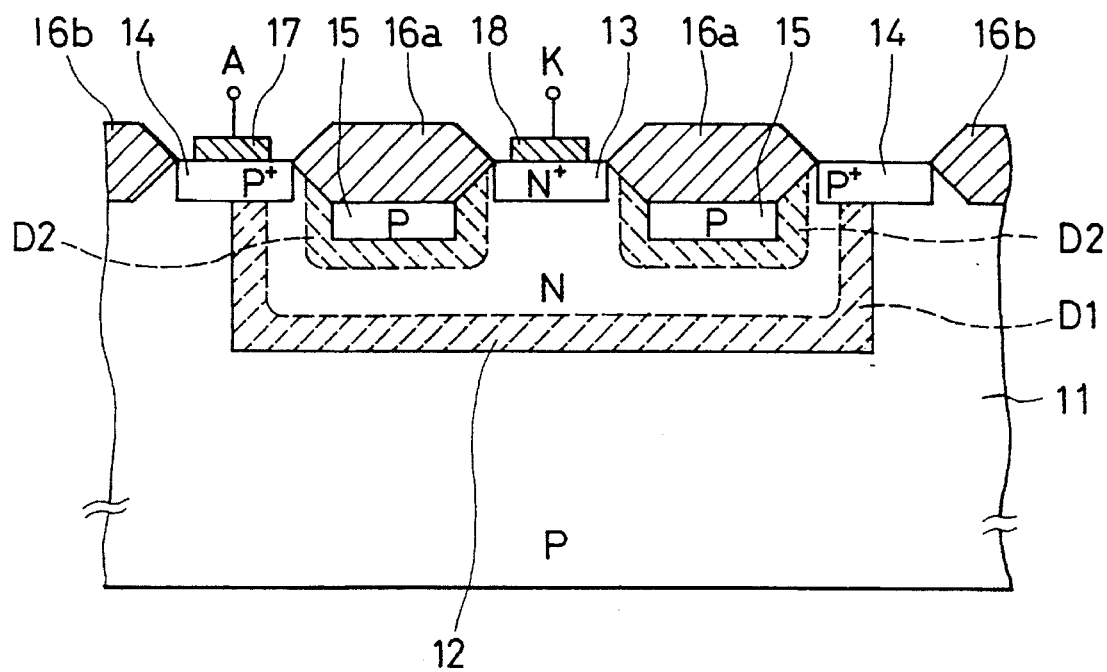
FIG. 3 is a partial cross-sectional view of the semiconductor device according to the first embodiment, showing the states of the depletion regions created in the substrate under the application of a reverse voltage less than the breakdown voltage.

When a reverse voltage is applied across the anode electrode 17 and the cathode electrode 18, as shown in FIG. 3, a first depletion region D1 is created near the P-N junction between the N-type cathode region 12 and the P-type substrate 11. Almost all the first depletion region D1 is on the side of the cathode region 12 and grows upward with the increasing reverse voltage. At the same time, a second depletion region D2 is created near the P-N junction between the N-type cathode region 12 and the P-type region 15. Almost all the second depletion region D2 also is on the side of the cathode region 12 and grows downward with the increasing reverse voltage.

Figure 4:
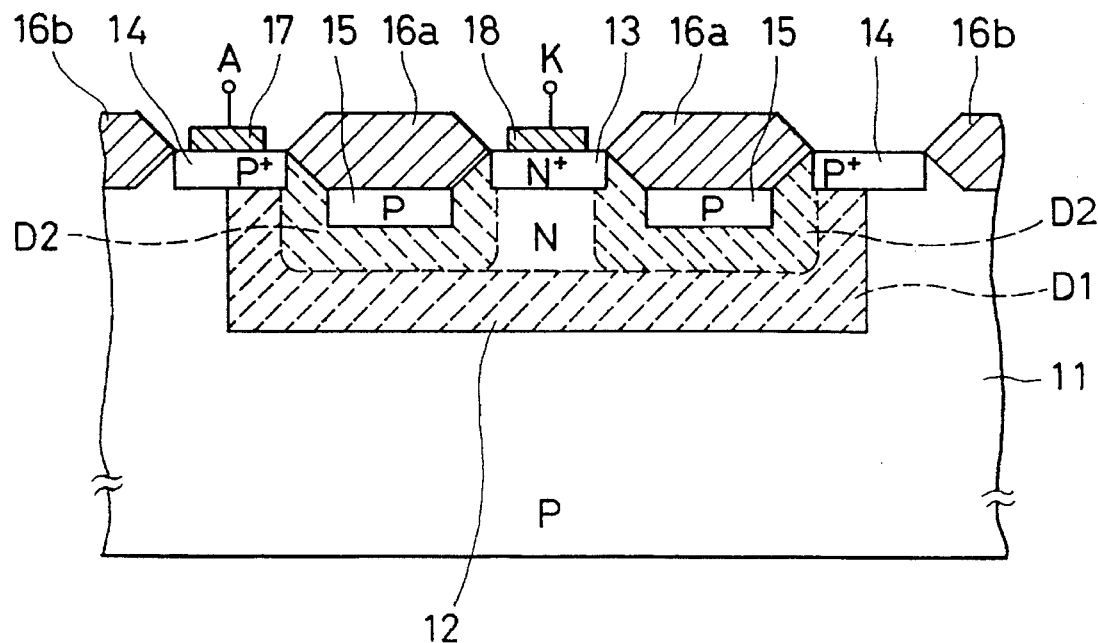
FIG. 4 is a partial cross-sectional view of the semiconductor device according to the first embodiment, showing the states of the depletion regions created in the substrate under the application of a reverse voltage greater than the breakdown voltage.

Finally, the first and second depletion regions D1 and D2 merge together, i.e., become pinched off, due to the applied reverse voltage over a breakdown voltage of the diode, as shown in FIG. 4 wherein when the reverse voltage is greater than the breakdown voltage of the diode, a breakdown phenomenon occurs in the diode so that a reverse, operating current flows between the anode region 14 and the cathode region 12. The applied voltage at this time is the reverse breakdown voltage of the diode. The first depletion region D1 does not reach the field insulator films 16a and 16b.

Therefore, the breakdown voltage of the diode is defined by the lateral distance $L_1$ of the P-type region 15. In other words, the doping concentration and the depth of the N-type cathode region 12 can be set independent of the diode breakdown voltage. This means that the doping concentration of the cathode region 12 can be higher and the depth thereof can be larger than those of the conventional semiconductor device of FIG. 1.

As a result, the operation resistance per unit area of the diode after its breakdown can be reduced, leading to reduction of the necessary chip area of the semiconductor device.

Also, since the breakdown voltage of the diode is defined by the length $L_1$ of the P-type region 15, it can be readily designed.

In the device of the first embodiment, the pinch off effect ensured to occur without destruction of the field insulator films 16a and 16b.

SECOND EMBODIMENT

Figure 5:
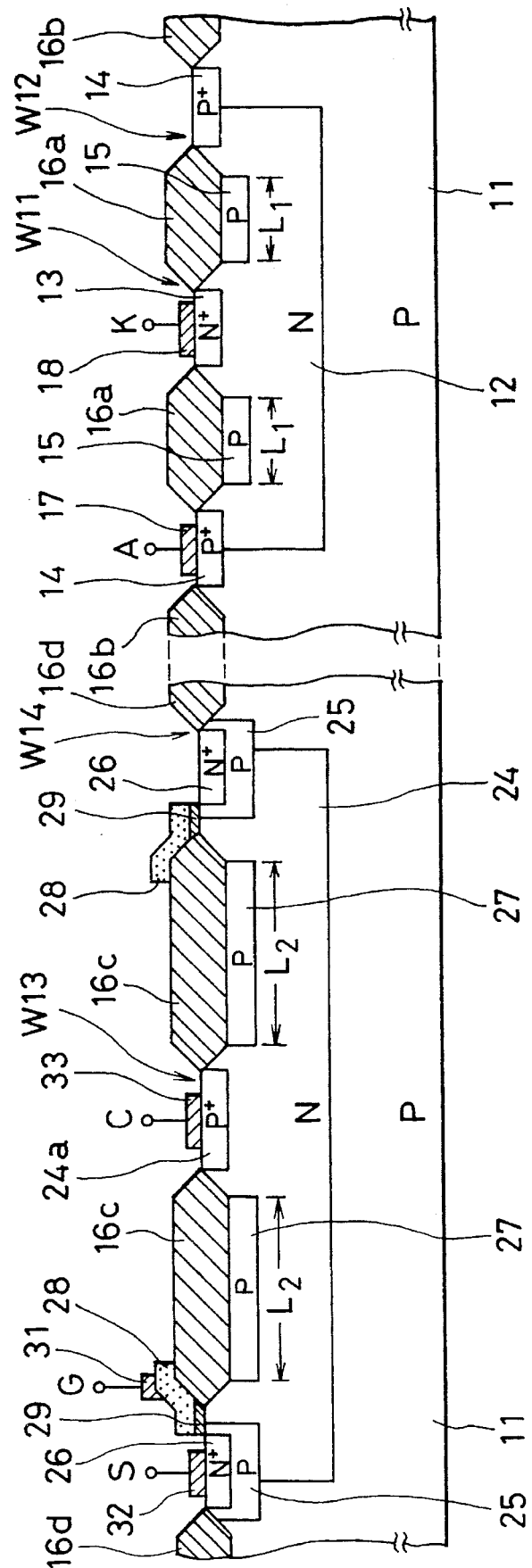
FIG. 5 is a partial cross-sectional view of a semiconductor device with a diode and an FET according to a second embodiment of the invention.

FIG. 5 shows a semiconductor device according to a second embodiment, which has the same diode as that of the first embodiment, and an N-channel lateral MOSFET created by the inventor, Yanagigawa, and filed as the Japanese Patent Application No. 6-154025. Therefore, the explanation about the MOSFET is only shown here.

In FIG. 5, field insulator films 16c and 16d are formed on the chief surface of the P-type semiconductor substrate 11. The outer field insulator film 16d surrounds the inner field insulator film 16c. The outer film 16d defines an active region in which the MOSFET with a high reverse breakdown voltage is provided. A window W13 is formed by the inner film 16c. A window W14 is formed by the inner and outer films 16c and 16d.

An N-type extension drain region 24 is formed in the active region by selectively doping an N-type impurity. Similar to the first embodiment, the interface of the substrate 11 and the extension drain region 24 has an upper end exposed through the window W14 from the field insulator films 16c and 16d. The upper end of this interface laterally extends along the window W14.

The extension drain region 24 has the same doping concentration and depth as those of the cathode region 12 of the diode.

A $P^+$-type collector region 24a is formed in the active region by selectively, heavily doping a P-type impurity. The collector region 24a is positioned on the extension drain region 24 and is exposed through the window W13 from the field oxide films 16c and 16d. The region 24a is contacted with the extension drain region 24.

A P-type channel formation region 25 is formed in the active region by selectively doping a P-type impurity. The channel formation region 25 is positioned on the interface of the extension drain region 24 and the substrate 11, and is exposed through the window W14 from the field oxide films 16c and 16d. The region 25 bridges the region 24 and the substrate 11, in other words, the region 25 is contacted with both of the region 24 and the substrate 11.

An $N^+$-type source region 26 is formed in the active region by selectively, heavily doping an N-type impurity. The source region 26 is exposed through the window W14 from the field oxide films 16c and 16d, and is positioned over the interface of the extension drain region 24 and the substrate 11. The region 26 is contacted with the channel formation region 25.

A source electrode 32 is formed on the source region 26. A collector electrode 33 is formed on the collector region 24a.

A P-type electric-field relaxation region, 27 is formed in the N-type extension drain region 24 to extend along the inner field insulator film 16c by selectively doping a P-type impurity. The region 27 is contacted with the bottom of the film 16c. The electric-field relaxation region 27 is electrically connected to the substrate 11 through a conductive path (not shown). Here, the substrate 11 is electrically connected to the source region 26 to be grounded and the region 27 also is grounded. The region 27 has a lateral distance $L_2$ along the line connecting the source and collector regions 26 and 24a, where $L_2$ is longer than $L_1$.

The electric-field relaxation region 27 has the same doping concentration and depth as those of the P-type region 12 of the diode.

A gate insulator film 29 is formed on the active region to surround the inner field insulator film 16c. The film 29 is positioned between the outer edge of the film 16c and the inner edge of the source region 26.

A gate electrode 28 is formed on the gate insulator film 29. The gate electrode 28 extends inward on the field insulator film 16c.

A gate interconnection layer 31 is formed on the gate electrode 28.

Figure 7:
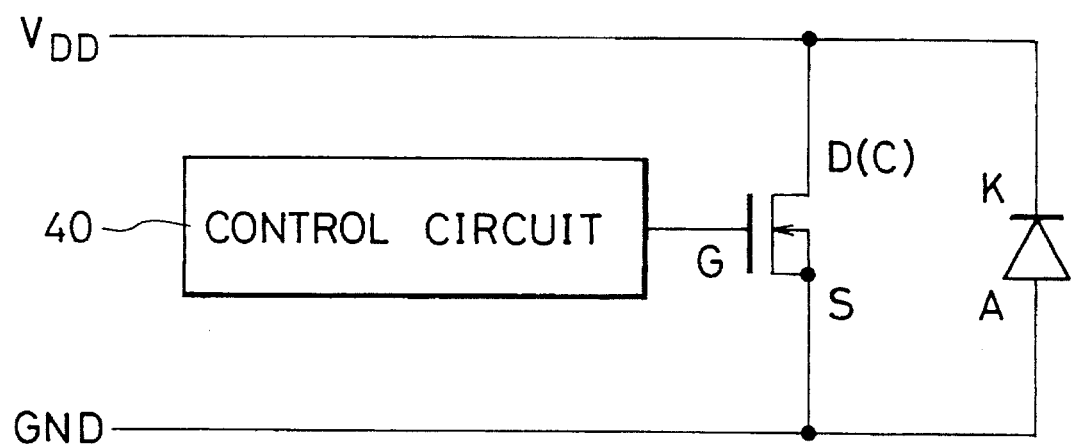
FIG. 7 is a circuit diagram of the semiconductor devices according to the second and third embodiments of the invention.

FIG. 7 shows an equivalent circuit of the semiconductor device according to the second embodiment. As shown in FIG. 7, the source and collector regions 26 and 24a of the MOSFET are electrically connected to the substrate 11 acting as an anode region and the cathode region 12, respectively. A control circuit 40 is electrically connected to the gate electrode 33. The reference character $V_{DD}$ indicates a supply voltage.

A load is electrically connected to the collector region 24a (i.e., floating collector). The MOSFET is used as a low-side switch for the load, in which the MOSFET as the switch is disposed on a low side to the load.

The operation of the MOSFET is as follows:

When a voltage greater than the threshold voltage $V_T$ is applied to the gate electrode 28, an inversion layer of an N-type is formed near the surface of the channel formation region 25, forming a channel. Thus, the source and collector regions 26 and 24a are electrically connected to each other. At this time, holes are introduced from the $P^+$-type collector region 24a into the extension drain region 24 due to the conductivity modulation by the applied voltage. Such the holes attract electrons to increase the flow rate of the electrons contributing the conduction current. Consequently, the resistance between the source and collector regions 26 and 24a appears to decrease.

When the applied voltage is lower than $V_T$, the channel region disappears, and a depletion region grows upward from the p-n junction of the extension drain region 24 and the substrate 11 in the region 24a in the same way as that of the above diode. On the other hand, since the electric-field relaxation region 27 is equal in electric potential to the source region 26, another depletion region grows downward from the p-n junction of the extension drain region 24 and the electric-field relaxation region 27 in the region 24a in the same way as that of the above diode. Thus, the current path between the source and collector regions 26 and 24a becomes open, i.e., the MOSFET switch becomes off.

During the switching process from on to off, the holes are absorbed by the electric-field relaxation region 27 and the substrate 11, which reduces the switching off time, i.e., enhances the operation speed. This means that the MOSFET of this semiconductor device can cope with any wanted high-speed operation.

Because the two depletion regions grow simultaneously due to the region 27, the doping concentration of the extension drain region 24 can be high and the depth thereof can be large to reduce the on-resistance of the MOSFET.

In the case that an excessive voltage is applied across the source and collector regions 26 and 24a, the two depletion regions grow and merge together (i.e., pinch off) and therefore, the breakdown voltage of the MOSFET is defined by the lateral distance $L_2$ of the electric-field relaxation region in the same way as that of the diode. This breakdown voltage does not depend upon the doping concentration of the drain region 24.

Figure 8A:
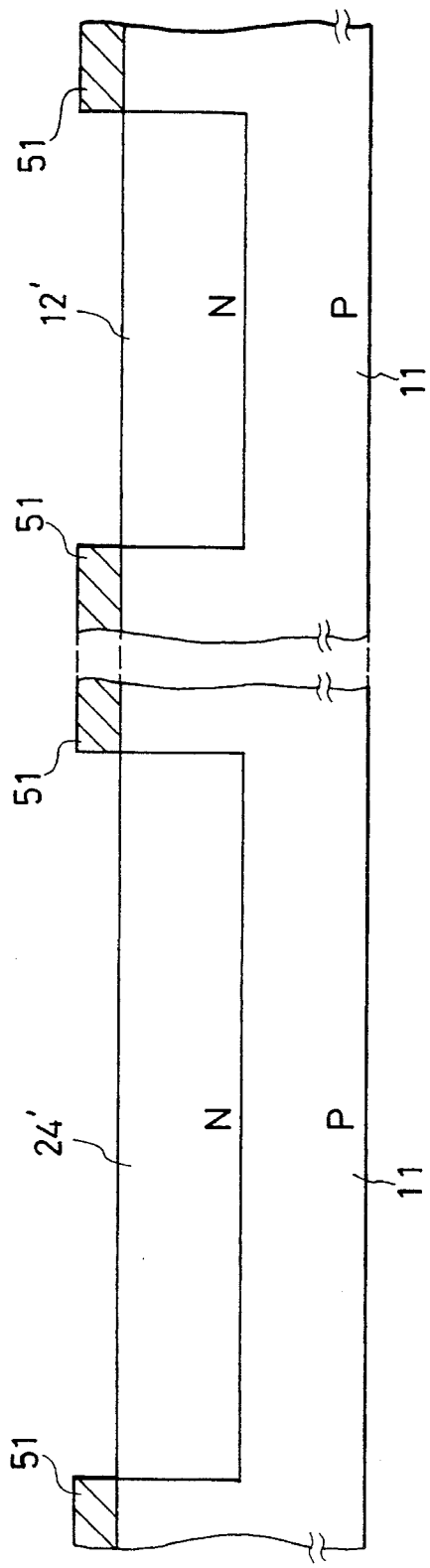
FIGS. 8A and 8B are partial cross-sectional views of the semiconductor device according to the second embodiment of the invention, respectively, showing the fabrication process steps thereof.

The semiconductor device according to the second embodiment is fabricated by the following process steps:

As shown in FIG. 8A, an N-type impurity is selectively ion-implanted into the P-type substrate 11 using a masking film 51, forming simultaneously N-type regions 12' and 24'.

Figure 8B:
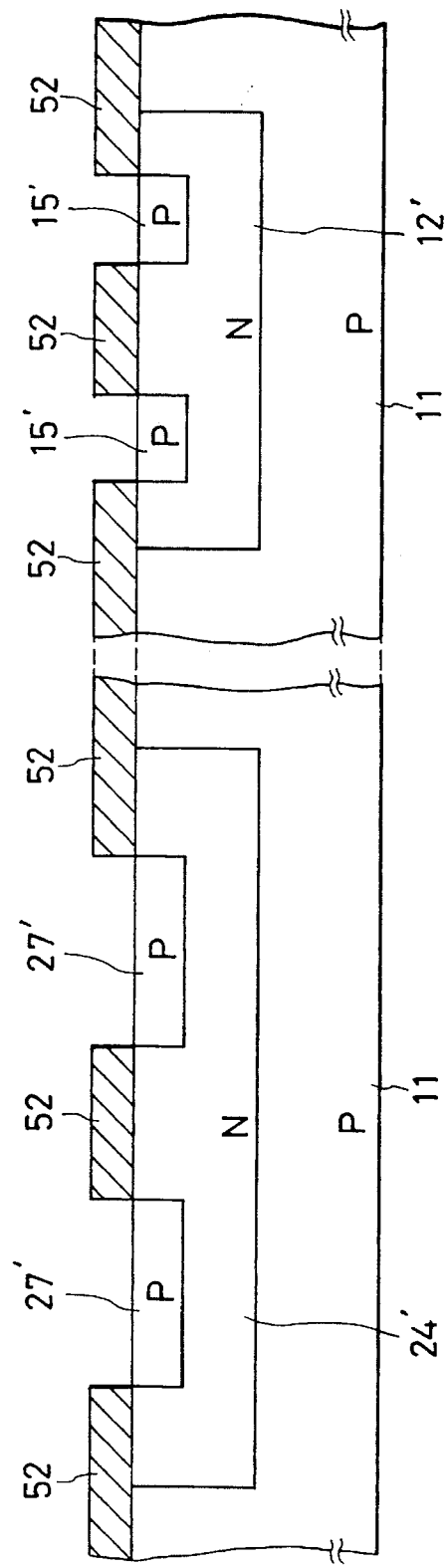

Then, as shown in FIG. 8B, a P-type impurity is selectively ion-implanted into the N-type regions 12' and 24' using a masking film 52, forming simultaneously P-type regions 15' and 27'.

Subsequently, the semiconductor device according to the second embodiment is obtained through popular process steps. The N-type regions 12' and 24' are changed to the cathode region 12 and the extension drain region 24, respectively. The P-type regions 15' and 27' are changed to the N-type region 15 and the electric-field relaxation region 27, respectively.

With the fabrication method, the N-type regions 12' and 24' are simultaneously formed and the P-type regions 15' and 27' are simultaneously formed. Accordingly, no additional step is required for forming the diode.

Since $L_2$ is longer than $L_1$, the breakdown voltage of the diode can be lower than that of the MOSFET, ensuring the protection of the MOSFET with the diode. This means that the relationship of the two breakdown voltages can be readily designed.

THIRD EMBODIMENT

Figure 6:
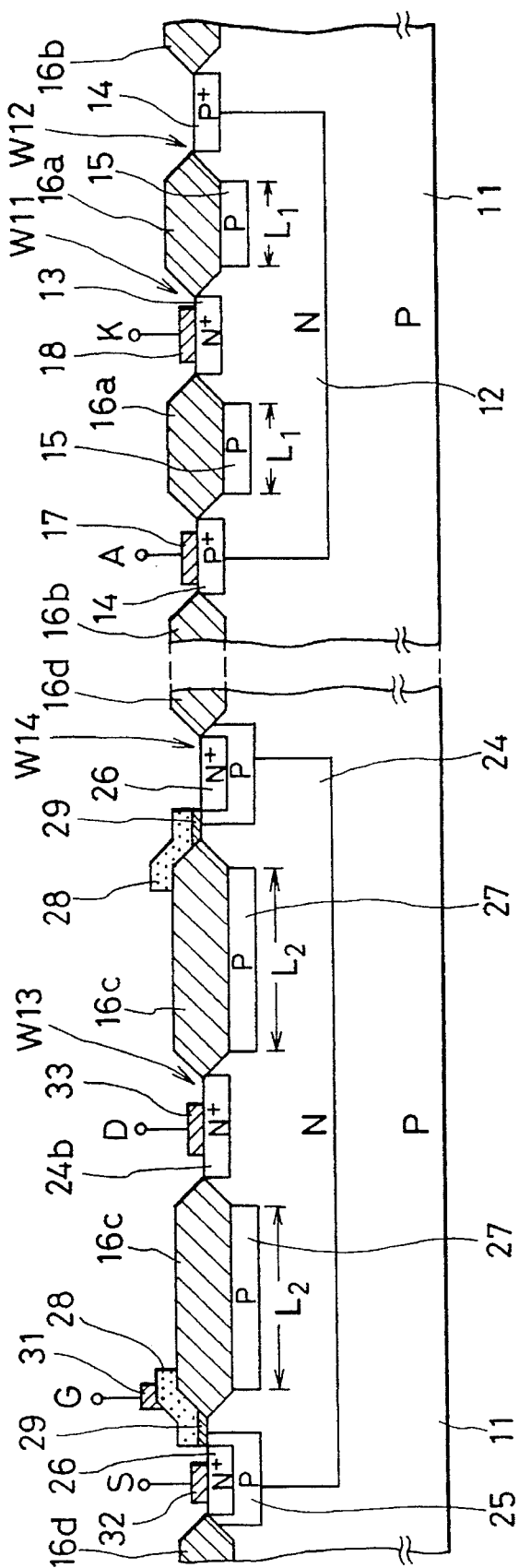
FIG. 6 is a partial cross-sectional view of a semiconductor device with a diode and an FET according to a third embodiment of the invention.

FIG. 6 shows a semiconductor device according to a third embodiment, which has the same structure as that of the second embodiment except that the $P^+$-type collector region 24a is replaced with an $N^+$-type drain region 24b.

In this embodiment, the MOSFET has the same operation as that of the second embodiment.

In the above first to third embodiments, the N-type regions 12 and 24 are formed by ion implantation. However, the N-type regions 12 and/or 24 may be formed by epitaxial growth.

Also, a P-type semiconductor substrate is used in the above embodiments. However, it is needless to say that an N-type semiconductor substrate may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device with a diode, said device comprising:

a semiconductor substrate;

a first impurity doped region of a first conductivity type formed in said semiconductor substrate, said first impurity doped region forming one of an anode region and a cathode region of said diode;

a second impurity doped region of a second conductivity type opposite to said first conductivity type formed in said semiconductor substrate, said second impurity doped region forming the other of said anode region and said cathode region of said diode;

said first impurity doped region and said second impurity doped region producing a first p-n junction at an interface of said first impurity doped region and said second impurity doped region;

a third impurity doped region of said first conductivity type formed in said second impurity doped region, said third impurity doped region being electrically connected to said first impurity doped region; and said third impurity doped region and said second impurity doped region producing a second p-n junction at an interface of said third impurity doped region and said second impurity doped region;

wherein when a reverse voltage is applied across said first impurity doped region and said second impurity doped region, a first depletion region is created near said first p-n junction and a second depletion region is created near said second p-n junction;

and wherein said first depletion region and said second depletion region merge together due to said reverse voltage over a breakdown voltage of said diode;

and wherein when said reverse voltage is greater than a given breakdown voltage of said diode, a breakdown phenomenon occurs in said diode so that a reverse, operating current flows between said first impurity doped region and said second impurity doped region.

2. A semiconductor device as claimed in claim 1, wherein said semiconductor substrate is of said first conductivity type;

and wherein a region of said substrate which is one of near, surrounding and contacting said second impurity doped region serves as said first impurity doped region.

3. A semiconductor device with a diode, said device comprising:

a first impurity doped region of a first conductivity type formed in a semiconductor substrate, said first impurity doped region forming one part of said diode;

a second impurity doped region of a second conductivity type opposite to said first conductivity type formed in said semiconductor substrate, said second impurity doped region forming the other part of said diode;

said first impurity doped region and said second impurity doped region producing a first p-n junction at an interface of said first impurity doped region and said second impurity doped region;

a third impurity doped region of said first conductivity type formed in said second impurity doped region, said third impurity doped region being electrically connected to said first impurity doped region; and said third impurity doped region and said second impurity doped region producing a second p-n junction at an interface of said third impurity doped region and said second impurity doped region;

wherein when a reverse voltage is applied across said first impurity doped region and said second impurity doped region, a first depletion region is created near said first p-n junction and a second depletion region is created near said second p-n junction;

and wherein said first depletion region and said second depletion region merge together due to said reverse voltage over a breakdown voltage of said diode, further comprising an FET formed on said substrate, said diode serving as a protection diode of said FET;

wherein said FET comprises:

an extension drain region of said second conductivity type formed in said substrate;

a channel formation region of said first conductivity type formed in said substrate;

a source region of said second conductivity type formed in said substrate;

a gate insulator film formed on said channel formation region;

a gate electrode formed on said gate insulator film;

an electric-field relaxation region of said first conductivity type formed in said extension drain region, said electric-field relaxation region being electrically connected to said substrate; and a collector region of said first conductivity type formed in said extension drain region;

wherein said source region and said collector region are positioned on each side of said electric-field relaxation region;

and wherein when a voltage is applied to said gate electrode, a channel is produced in a surface area of said channel formation region under said gate insulator film, electrically connecting said source region and said collector region with each other through said channel.

4. A semiconductor device as claimed in claim 3, wherein said diode further comprises:

a first contact region of said first conductivity type formed in said semiconductor substrate, said first contact region being contacted with said first impurity doped region; and a second contact region of said second conductivity type formed in said semiconductor substrate, said second contact region being contacted with said second impurity doped region; and said first contact region and said second contact region being positioned on each side of said third impurity doped region;

wherein said third impurity doped region of said diode has a first lateral length along a line connecting said first contact region and said second contact region, and said electric-field relaxation region of said FET has a second lateral length along a line connecting said source region and said collector region;

and wherein said first lateral length is smaller than said second lateral length.

5. A semiconductor device as claimed in claim 4, wherein said second impurity doped region of said diode is the same in doping concentration as said extension drain region of said FET.

6. A semiconductor device as claimed in claim 4, wherein said third impurity doped region of said diode is the same in doping concentration as said electric-field relaxation region of said FET.

7. A semiconductor device as claimed in claim 6, further comprising a field insulator film on said substrate;

wherein said third impurity doped region of said diode is positioned under a part of said field insulator film;

and wherein said electric-field relaxation region of said FET is positioned under a part of said field insulator film.

8. A semiconductor device with a diode, said device comprising:

a first impurity doped region of a first conductivity type formed in a semiconductor substrate, said first impurity doped region forming one part of said diode;

a second impurity doped region of a second conductivity type opposite to said first conductivity type formed in said semiconductor substrate, said second impurity doped region forming the other part of said diode;

said first impurity doped region and said second impurity doped region producing a first p-n junction at an interface of said first impurity doped region and said second impurity doped region;

a third impurity doped region of said first conductivity formed in said second impurity doped region, said third impurity doped region being electrically connected to said first impurity doped region; and said third impurity doped region and said second impurity doped region producing a second p-n junction at an interface of said third impurity doped region and said second impurity doped region;

wherein when a reverse voltage is applied across said first impurity doped region and said second impurity doped region, a first depletion region is created near said first p-n junction and a second depletion region is created near said second p-n junction;

and wherein said first depletion region and said second depletion region merge together due to said reverse voltage over a breakdown voltage of said diode, further comprising an FET formed on said semiconductor substrate, said diode serving as a protection diode of said FET;

wherein said FET comprises:
- an extension drain region of said second conductivity type formed in said semiconductor substrate;
- a channel formation region of said first conductivity type formed in said semiconductor substrate;
- a source region of said second conductivity type formed in said semiconductor substrate;
- a gate insulator film formed on said channel formation region;
- a gate electrode formed on said gate insulator film;
- an electric-field relaxation region of said first conductivity type formed in said extension drain region, said electric-field relaxation region being electrically connected to said semiconductor substrate; and
- a drain region of said second conductivity type formed in said extension drain region; semiconductor substrate;

wherein said source region and said drain region are positioned on each side of said electric-field relaxation region;

and wherein a voltage is applied to said gate electrode, a channel is produced in a surface area of said channel formation region under said gate insulator film, electrically connecting said source region and said drain region with each other through said channel.

9. A semiconductor device as claimed in claim 8, wherein said diode further comprises:
- a first contact region of said first conductivity type formed in said semiconductor substrate, said first contact region being contacted with said first impurity doped region; and
- a second contact region of said second conductivity type formed in said semiconductor substrate, said second contact region being contacted with said second impurity doped region; and
- said first contact region and said second contact region being positioned on each side of said third impurity doped region;

wherein said third impurity doped region of said diode has a first lateral length along a line connecting said first contact region and said second contact region, and said electric-field relaxation region of said FET has a second lateral length along a line connecting said source region and said drain region;

and wherein said first lateral length is smaller than said second lateral length.

10. A semiconductor device as claimed in claim 8, wherein said second impurity doped region of said diode is the same in doping concentration as said extension drain region of said FET.

11. A semiconductor device as claimed in claim 8, wherein said third impurity doped region of said diode is the same in doping concentration as said electric-field relaxation region of said FET.

* * * * *